United States Patent [19]
Rahman et al.

[11] Patent Number: 5,688,893
[45] Date of Patent: Nov. 18, 1997

[54] METHOD OF USING A LEWIS BASE TO CONTROL MOLECULAR WEIGHT OF NOVOLAK RESINS

[75] Inventors: M. Dalil Rahman, Warwick; Daniel P. Aubin, Rockville; Dana L. Durham, East Greenwich; Ralph R. Dammel, Coventry, all of R.I.

[73] Assignee: Hoechst Celanese Corporation, Somerville, N.J.

[21] Appl. No.: 771,715

[22] Filed: Dec. 20, 1996

Related U.S. Application Data

[62] Division of Ser. No. 997,942, Dec. 29, 1992, Pat. No. 5,614,349.
[51] Int. Cl.⁶ .............................. C08G 8/04; G03F 7/023
[52] U.S. Cl. ........................ 528/146; 528/145; 528/155
[58] Field of Search ............................ 528/145, 146, 528/155

[56] References Cited

U.S. PATENT DOCUMENTS

| | | | |
|---|---|---|---|
| 3,666,473 | 5/1972 | Colom et al. | 528/146 |
| 4,260,730 | 4/1981 | Sekmakas et al. | 528/145 |
| 4,870,154 | 9/1989 | Saeki et al. | 528/145 |
| 5,286,606 | 2/1994 | Rahman et al. | 430/311 |
| 5,476,750 | 12/1995 | Rahman et al. | 430/168 |
| 5,614,349 | 3/1997 | Rahman et al. | 430/169 |

FOREIGN PATENT DOCUMENTS

| | | |
|---|---|---|
| WO 93/12152 | 6/1993 | WIPO . |
| WO 93/18437 | 9/1993 | WIPO . |
| WO 94/01807 | 1/1994 | WIPO . |
| WO 94/12912 | 6/1994 | WIPO . |
| WO 94/14858 | 7/1994 | WIPO . |
| WO 94/14863 | 7/1994 | WIPO . |

OTHER PUBLICATIONS

JP,A,04065415 Hitachi Chemical Co., Ltd. (see abstract) (C–952) (5312) and Patent Abstracts of Japan, vol. 16, No. 269 (C–952) (5312), Jun. 17, 1992.

*Primary Examiner*—John S. Chu
*Attorney, Agent, or Firm*—Andrew F. Sayko, Jr.

[57] ABSTRACT

The present invention provides methods for producing water insoluble, aqueous alkali soluble novolak resins having a precise and consistent molecular weight, by adjusting the concentration of Lewis base. A method is also provided for producing photoresist composition from such novolak resins and for producing semiconductor devices using such photoresist compositions.

5 Claims, No Drawings

METHOD OF USING A LEWIS BASE TO CONTROL MOLECULAR WEIGHT OF NOVOLAK RESINS

This application is a division of application Ser. No. 07/997,942 filed Dec. 29, 1992 which application is now U.S. Pat. No. 5,614,349.

BACKGROUND OF THE INVENTION

The present invention relates to a process for producing a novolak resin of substantially consistent molecular weight and for using such novolak resin in light-sensitive photoresist compositions. The present invention also relates to a process for making light-sensitive compositions useful in positive-working photoresist compositions. Further, the present invention relates to a process for coating substrates with these light-sensitive photoresist compositions as well as the process of coating, imaging and developing these light-sensitive mixtures on substrates.

Photoresist compositions are used in microlithography processes for imaging miniaturized electronic components such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Novolak resins are frequently used as a polymeric binder in liquid photoresist formulations. These resins are typically produced by conducting a condensation reaction between formaldehyde and one or more multi-substituted phenols, in the presence of an acid catalyst, such as oxalic acid. In producing sophisticated semiconductor devices, it has become increasingly important to provide novolak resin having a precise and substantially consistent molecular weight. It was discovered that when the level of Lewis base in the speedstick is too low, the production of novolak resin having a substantially consistent molecular weight failed because of the depolymerization of resin during a high temperature distillation step of the process.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the ration of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and it resistance to etching solutions.

Positive working photoresist compositions are currently favored over negative working resist because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and underdeveloped areas of the resist coating translate into accurate pattern transfer of the mask image onto the substrate.

SUMMARY OF THE INVENTION

The present invention relates to a process for producing novolak resins having a substantially consistent molecular weight. The invention also relates to a process for producing a photoresist containing such novolak resins. The invention further relates to the control of the amount of Lewis base in a process of producing such novolak resins having a substantially consistent molecular weight. The invention further relates to a process for producing semiconductor devices using such photoresists containing such a novolak resin and a photosensitizer.

The process of the subject invention provides a water insoluble, aqueous base soluble novolak resin obtained by condensing with formaldehyde one or more phenolic compounds, such as meta-cresol, para-cresol, 3,5-dimethylphenol or 2,4-dimethylphenol. The condensation reaction is preferably carried out in the presence of a catalyst, such as oxalic acid or maleic anhydride. In the process of the present invention it is necessary to adjust the amount of Lewis base present, before and/or after the condensation, to stabilize the molecular weight.

DETAILED DESCRIPTION OF THE PREFERRED EMBODIMENT

The present invention provides a process for producing a novolak resin having a substantially consistent molecular weight. The subject process comprises providing an admixture of formaldehyde and one or more phenolic compounds, condensing the formaldehyde with the one or more phenolic compounds, preferably in the presence of a catalyst, preferably an acid catalyst, more preferably oxalic acid or maleic anhydride; adjusting the Lewis base concentration, before and/or after the condensation, to a level of from about 10 to about 1000 parts per million by weight (ppm), preferably 20 to 500 ppm, most preferably 30 to 300 ppm, to produce a water insoluble, aqueous alkali soluble novolak resin having a desired and substantially consistent molecular weight.

The present invention further provides a process for producing a positive photoresist composition. The subject process comprises:

a) providing an admixture of formaldehyde, one or more phenolic compounds and a catalytic amount of a suitable catalyst;

b) condensing the formaldehyde with the one or more phenolic compounds, preferably in the presence of a catalyst, adjusting the Lewis base concentration of the admixture, before and/or after the condensation, to a level of from about 10 to about 1000 ppm, preferably 20 to 500 ppm, most preferably 30 to 300 ppm, to produce a water insoluble, aqueous alkali soluble novolak resin having a desired and substantially consistent molecular weight;

c) providing an admixture of: 1) a photosensitive component in an amount sufficient to photosensitize the photoresist composition, 2) the water insoluble, aqueous alkali soluble novolak resin having a desired and substantially consistent molecular weight and 3) a suitable solvent.

The invention further provides a method for producing a semiconductor device by producing a photo-image on a substrate by coating a suitable substrate with a positive working photoresist composition comprising:

a) providing an admixture of formaldehyde, one or more phenolic compounds and a catalytic amount of a suitable catalyst;

b) condensing the formaldehyde with the one or more phenolic compounds, preferably in the presence of an acid catalyst, adjusting the Lewis base concentration, before and/or after the condensation, to a level of from about 10 to about 1000 ppm, preferably from about 20 to about 500 ppm, most preferably from about 30 to 300 ppm, to produce a water insoluble, aqueous alkali soluble novolak resin having a desired and substantially consistent molecular weight;

c) providing an admixture of: 1) a photosensitive component in an amount sufficient to photosensitize the photoresist composition; 2) the water insoluble, aqueous alkali soluble novolak resin having a desired and substantially consistent molecular weight and 3) a suitable solvent, to provide a photoresist composition;

d) coating a suitable substrate with the photoresist composition;

e) heat treating the coated substrate until substantially all of the solvent is removed, image-wise exposing the photoresist composition and removing the image-wise exposed areas of such composition with a suitable developer, such as an aqueous alkaline developer, optionally one may perform a baking of the substrate either immediately before or after the removing step.

It has been surprisingly found that a novolak resin having a desired molecular weight cannot readily be obtained by condensing formaldehyde with one or more phenolic compounds, in the presence of a catalyst, unless one either: 1) adjusts the concentration of Lewis base before condensation, or 2) adjusts the amount of the Lewis base after condensation, or 3) adjusts the Lewis base concentration both before and after condensation, or 4) adjusts the Lewis base concentration in the raw materials, such as the cresols, by adding or removing Lewis base.

It was discovered that, due to the absence or too low a level of Lewis base, the novolak resin was partially depolymerized during the manufacturing process. The physical properties of the depolymerized novolak resin change because of this degradation and it is in an undesirable way for photoresist compositions. This problem can be substantially avoided by adjusting the amount of Lewis base before and/or after the condensation step of the novolak manufacturing process. The Lewis base can be present in the range of from about 10 to 1000 ppm, preferably from about 20 to 500 ppm, most preferably from about 30 to 300 ppm.

Lewis bases that may be used include hydroxides of organic counterions such as tetra-substituted ammonium hydroxide (Formula 1) or other organic bases (Formulas 2–4), added to the reaction mixture either neat as a solid or liquid or used either as a salt or a solution either in water or a suitable organic solvent, or a mixture of an organic solvent and water.

Formula 1 where the substituents A, B, C and D may be $C_1$–$C_{10}$ alkyl or alkenyl (both straight-chain and branched), particularly preferred are $C_1$–$C_2$ alkyl, the alkyl chains may optionally be heteroatom substituted with one or more of N or O; $C_3$–$C_{10}$ cycloalkyl, preferably 5–6, with optional heteroatom substitution with one or more of N or O; $C_6$–$C_{12}$ aryl or alkylaryl ($C_1$–$C_{10}$ alkyl, $C_6$–$C_{12}$ aryl) substituents; $C_1$–$C_{10}$ alkyloxy or $C_3$–$C_{10}$ cycloalkyloxy, $C_6$–$C_{12}$ aryloxy; $C_1$–$C_{10}$ alkyl or $C_6$–$C_{12}$ aryl carboxylic acid or ester —COOR and keto-substitutents —C(=O)R, where R is H, $C_1$–$C_{10}$ alkyl or $C_6$–$C_{12}$ aryl, in particular methyl as alkyl, and including heteroatom-substituted $C_6$–$C_{12}$ aryl residues, substituted with one or more of N or O, in particular aza and oxa-substitution; amine, $C_1$–$C_{10}$ alkyl- and dialkylamino, preferably $C_1$ to $C_5$ alkyl, most preferably $C_1$ to $C_2$; $C_3$–$C_{10}$ cycloalkylamino and dicycloalkylamino, preferably $C_5$–$C_6$ cycloalkyl; $C_3$–$C_{10}$ cycloalkyl where two or more of the substituents A to D are part of a cyclic or polycylic ring system which optionally may be heteroatom substituted with one or more of N or O. Most preferred is tetramethylammonium hydroxide as an aqueous solution.

Other preferred Lewis bases are shown in formulas 2 to 4:

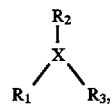

Formula 2

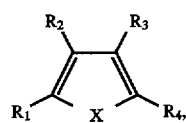

Formula 3

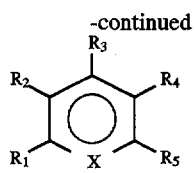

Formula 4 where X=N or CR$_6$, provided that there is at least one basic center in the molecule if X=CR$_6$ and where in formula 2 X can be P; where R$_1$ to R$_6$ may be any of the following: hydrogen, C$_1$–C$_{10}$ alkyl (both straight-chain and branched), preferably C$_1$–C$_5$ alkyl, most preferred C$_1$–C$_2$ alkyl, and where the alkyl chains may optionally be heteroatom substituted with one or more of N or O; C$_3$–C$_{10}$ cycloalkyl, preferably C$_5$–C$_6$, with optional heteroatom substitution with one or more of N or O, where in the case of azacycloalkyl substituents, attachment to the aryl ring is preferably effected via the aza site; hydroxy, C$_1$–C$_{10}$ alkyloxy or C$_3$–C$_{10}$ cycloalkyloxy, C$_6$–C$_{12}$ aryloxy; C$_1$–C$_{10}$ alkyl or C$_6$–C$_{12}$ aryl carboxylic acid or ester —COOR and ketosubsitutent —C(=O)R, where R is H, C$_1$–C$_{10}$ alkyl or C$_6$–C$_{12}$ aryl, in particular methyl as alkyl, and including heteroatom-substituted C$_6$–C$_{12}$ aryl residues substituted with one or more of N or O, in particular aza and oxa-substitution; halogen or nitro; amine, C$_1$–C$_{10}$ alkyl- and dialkylamino, preferably C$_1$ to C$_5$ alkyl, most preferably C$_1$ to C$_2$; C$_3$–C$_{10}$ cycloalkylamino and dicycloalkylamino, preferably C$_5$–C$_6$ cycloalkyl; C$_3$–C$_{10}$ cycloalkyl where two or more of the substituents R$_1$ to R$_5$ are part of a cyclic or polycylic ring system which optionally may be heteroatom substituted with one or more of N or O, wherein adjacent the R group can be part of a C$_5$–C$_{12}$ cyclic group, preferably C$_5$–C$_7$.

The consistency of the molecular weight is determined by measuring the Void Viscosity ("V.V"), the GPC Molecular Weight of the final novolak resin and the GPC Molecular Weight of the novolak resin before distillation. A novolak resin having a desired and consistent molecular weight produced according to the process of the present invention will have a V.V ranging from more than 10.0 to less than 40.0, preferably from about 12 to about 32.0, more preferably from about 14.0 to about 24.0, most preferably from about 16.0 to about 22.0 and a ratio of final molecular weight ("MW") to molecular weight before distillation ["MW(BD)"] [Ratio: MW/MW(BD)] from greater than about 0.6 to less than about 1.7, preferably from about 0.7 to about 1.5, more preferably from about 0.8 to about 1.3, most preferably from about 0.9 to about 1.1.

Void Viscosity and GPC Molecular Weight am measured using the following procedures:

Void Viscosity Procedure

Make a 26% solution of the resin (6.50 grams of resin in 100 ml jar equipped with magnetic stir bar and cap) add up to 25.00 grams of AZ Thinner Solvent. Filter the solution through a 5 micron membrane syringe filter. Fill viscometers (size #200) in the inverse position to the second line. Place the viscometer in viscosity bath at 25° C. (constant temperature) for 15–20 minutes. Take flow time of resin solution (seconds) and repeat till two consistant readings are obtained. Calculation: Void Viscosity=flow time (in seconds)×constant in centistokes per second at 25° C.

Molecular Weight (MW)

The molecular weight of the polymers, whether weight average molecular weight MW, or number average molecular weight MN, were measured by gel permeation chromatography (GPC) performed on dilute solutions of the polymer in tetrahydrofuran (THF). The actual apparatus employed consisted of a Waters (Millipore Corporation) programmable automatic sampler, vacuum pump, chromatography columns with heater, and a differential refractometer connected to a Shimadzu CR 30A data reduction system with accompanying software (version 1.1, Shimadzu part no. T/N 22301309-91). The refractormeter used was a Waters model 410 and four chromatography columns, 500 Angstrom, 1000 Angstrom, 10,000 Angstrom and 100,000 Angstrom (available from Waters) were connected in series. The system was calibrated using multiple available polystyrene standards ranging in molecular weight as follows:

| GPC CALIBRATION | |
|---|---|
| Calibration Standard (Polystyrene) | Molecular Weight |
| 1 | 470,000 |
| 2 | 170,000 |
| 3 | 68,000 |
| 4 | 34,500 |
| 5 | 9,200 |
| 6 | 3,200 |
| 7 | 1,250 |

The standards are essentially monodisperse, consisting substantially of a single molecular weight. With the system thus claibrated the weight average molecular weight MW, was obtained for polymers produced in accordance with the examples given hereinafter.

The present invention relates to a process for producing a novolak resin, a process for producing a photoresist composition containing such a novolak resin and a process for producing semiconductor devices using such a photoresist composition. The photoresist composition is formed by providing an admixture of a photosensitizer, the subject water insoluble, aqueous alkali soluble novolak resin and a suitable solvent. Suitable solvents for such photoresists may include propylene glycol mono-alkyl ether, propylene glycol alkyl (e.g. methyl) ether acetate, ethyl-3-ethoxypropionate, ethyl lactate, mixtures of ethyl-3-ethoxypropionate and ethyl lactate, butyl acetate, xylene, diglyme, ethylene glycol monoethyl ether acetate. The preferred solvents are propylene glycol methyl ether acetate (PGMEA) and ethyl-3-ethoxypropionate (EEP).

Other optional ingredients such as colorants, dyes, anti-striation agents, leveling agents, plasticizers, adhesion promoters, speed enchanters, solvents and such surfactants as non-ionic surfactants may be added to the solution of novolak resin, sensitizer and solvent before the photoresist composition is coated onto a substrate. Examples of dye additives that may be used together with the photoresist compositions of the present invention include Methyl Violet 2B (C.I. 1%. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl) -ester; stearic acid; dicamphor, polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be included, for example, beta-(3-4-epoxycyclohexyl)-ethyltrimethoxysilane;

p-methyl-disilane-methyl methacrylate; vinyltrichlorosilane; and gamma-amino-propyl triethoxysilane up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95 percent by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10 percent weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexalkyl disilazine.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid based etching solution. The photoresist compositions of the present invention are resistant to acid-based etching solutions and provide effective protection for the unexposed photoresist-coating areas of the substrate.

The following specific examples will provide detailed illustrations of the methods of producing and utilizing compositions of the present invention. Unless otherwise specified, all percentages and parts are by weight. These examples are not intended, however, to limit or restrict the scope of the invention in any way and should not be construed as providing conditions, parameters or values which must be utilized exclusively in order to practice the present invention.

EXAMPLE 1

100 grams of a cresol mixture (42% m-cresol, 48% p-cresol, 10% 2,4 and 2,5 xylenol, having less than 100 ppb of any metal ion and a Lewis base content less than 10 ppm) was placed in a four necked flask equipped with a condenser, a thermometer and a dropping funnel. One gram of oxalic acid was added and the flask was heated to 95° C. 52.97 g of formaldehyde (mole ratio of cresol/formaldehyde 1:0.72) was added dropwise over three hours. The reaction was allowed to continue for 7 more hours at 95° C. After the condensation reaction, 1 gram of ammonium hydroxide solution (28%) was added slowly and the unreacted raw materials were distilled off using a stepwise distillation technique keeping the temperature constant at 140° C. for 1 hour, 160° C. for 2 hours and 190° C. for 1 hour. Then a vacuum was pulled and the flask heated. When the flask temperature was about 200° C. and the vacuum was 30 mm, the molten resin was discharged to an aluminum troy. The void viscosity of the resin and GPC molecular weight were measured are shown in Table 1.

EXAMPLE 2 AND 3

The procedure of example 1 was repeated using the ammonium hydroxide of Example 1 as the Lewis base, to make novolak resin with substantially consistent molecular weight, as shown in Table 1.

TABLE 1

The Effect of Lewis Bases on Void Viscosity and GPC Molecular Weight of Novolak Resins

| Example | V.V | MW | MW(BD) |
|---|---|---|---|
| 1 | 16.2 | 9775 | 8743 |
| 2 | 20.8 | 12476 | 7868 |
| 3 | 14.9 | 9838 | 9640 |

Note: V.V - void viscosity; MW - molecular weight of resin by GPC; MW(BD) - molecular weight of resin sample obtained before distillation.

EXAMPLE 4

100 grams of the cresols of Example 1 were placed in a four necked flask equipped with a condenser, a thermometer, and a dropping funnel. One gram of oxalic acid (1% of cresols), 4 grams of water and 0.02 gram of 3-picoline (0.02% of cresols) were added and the flask was heated to 95° C. 52.97 grams of formaldehyde (molar ratio of cresol/formaldehyde 1/0.72) added dropwise over three hours. The reaction was allowed to continue for 8 hours at 95° C. and a sample was collected for GPC analysis to determine the molecular weight. The unreacted raw materials were distilled off using a stepwise distillation technique keeping the temperature constant at 140° C. for 1 hour, 190° C. for 2 hours and 215° C. for 1 hour. Then a vacuum was pulled and the flask heated. When the flask temperature was about 235° C. and the vacuum pressure was 20 mm, the molten resin was discharged to aluminum tray. The void viscosity and GPC molecular weight were measured and are shown in Table 2.

EXAMPLE 5 TO 9

The procedure of example 4 was repeated using Lewis base to make the novolak resins of examples 5 to 9. The effect of these bases on void viscosity and GPC molecular weight are shown in Table 2.

TABLE 2

Effect of Different Lewis Bases on Viscosity and GPC Molecular Weight of Novolak Resin

| Example | Base | Base(%) | V.V | MW/MW(BD)*# |
|---|---|---|---|---|
| 4 | NH$_4$OH | 0.28 | 17.9 | 16056/13297 |
| 5 | Triethylamine | 0.50 | 17.3 | 9805/10590 |
| 6 | Aniline | 0.05 | 17.9 | 11431/10888 |
| 7 | NaBH$_4$ | 0.02 | 17.7 | 14339/12662 |
| 8 | NaOH | 0.03 | 19.6 | 13565/14609 |
| 9 | Triphenylphosphine | 0.14 | 17.8 | 13168/13715 |

COMPARATIVE EXAMPLE 10

The procedure of Example 4 was repeated to make novolak resin of, without using any Lewis base, to show that the resin obtained depolymerized as shown below:
Void Viscosity—9.4
MW—4261
MW(BD)—11443

EXAMPLE 11

A photoresist solutions was prepared as follows: Into 73.88 grams of PGMEA, 19.58 grams of novolak resin from Example 1 was added. A mixture of photosensitizers was added as follows: 3.26 grams of 2,1,5-diazonaphthoquinone sulfonic acid ester (40 to 80%) of 2,3,4,4'-tetrahydroxybenzophenone, 2.61 grams of the 2,1,5-diazonaphthoquinone sulfonic acid ester (40 to 80%) ester of 2,3,4-trihydroxybenzophenone and 0.651 grams of the 2,1,5-diazonaphthoquinone sulfonic acid ester (82 to 91%) ester of 2,3,4-trihydroxybenzophenone. The photosensitizers and 0.020 grams of FC-430 surfactant (fluoroaliphatic polymeric ester available from 3M) were dissolved and filtered through a membrane filter (0.2 µm in pore size). The photoresist solution was spin coated, using standard techniques, onto quartz plates at a constant speed to obtain layers of photoresist having an initial thickness of 1.5 µm. The plates were baked in a circulating air oven at 90° C. for 30 minutes.

The photoresist was compared with a control photoresist (AZ 6212) for photospeed, contrast, dark film loss, thermal stability and aging. Photospeed 2.6% faster; contrast—no difference; dark film loss 4% faster; thermal stability—no difference; aging (5 days at 50° C.)—no difference.

EXAMPLE 12

A photoresist formulation was prepared by formulating a solution containing (by weight) 71% EEP, 21.8% of the novolak resin in Example 1, 5.16% tricyclodecanedimethylol 2,1,5-diester, 2.06% trifluromethylsulfonyloxybicyclo(2,2',1)-hept-5-2,3-dicarboxymide and 0,025% of FC-430 fluoroaliphatic polymeric ester (available from 3M).

We claim:
1. A method for producing a water insoluble, aqueous alkali soluble novolak resin comprising:

a) providing an admixture of formaldehyde, one or more phenolic compounds and a catalytic amount of a acidic catalyst;

b) Lewis base concentration before condensation providing such admixture with a of from about 10 to 1000 ppm;

c) condensing the formaldehyde with the one or more phenolic compounds, in presence of the catalyst, and thereby producing a water insoluble, aqueous alkali soluble novolak resin having a substantially consistent molecular weight.

2. The method of claim 1 wherein the Lewis base is a hydroxide of an organic counterion.

3. The method of claim 2 wherein the Lewis base is an ammonium hydroxide.

4. The method of claim 1 wherein the Lewis base is an organic base, added either: 1) neat as a solid or liquid, or 2) as a salt or a solution in water, a suitable organic solvent or a mixture of an organic solvent and water; wherein the Lewis base is an organic compound having one of the following formulas:

Formula 2

Formula 3

Formula 4

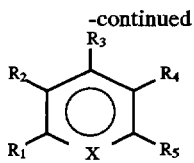

where X=N or $CR_6$, provided that there is at least one basic center in the molecule if X=$CR_6$ and where in Formula 2, X can be P; where $R_1$ to $R_6$ may be any of the following:

1) hydrogen, $C_1$–$C_{10}$ alkyl (both straight-chain and branched) where the alkyl chains may be heteroatom substituted;
2) $C_3$–$C_{10}$ cycloalkyl;
3) hydroxy;
4) $C_1$–$C_{10}$ alkyloxy, $C_3$–$C_{10}$ cycloalkyloxy and $C_6$–$C_{12}$ aryloxy;
5) $C_1$–$C_{10}$ carboxylic acid or ester —COOR and keto-subsitutent —C(=O)R, where R is H, $C_1$–$C_{10}$ alkyl or $C_6$–$C_{12}$ aryl;
6) halogen or nitro;
7) amino, $C_1$–$C_{10}$ alkyl- or dialkylamino;
8) $C_3$–$C_{10}$ cycloalkylamino and dicycloalkylamino; and
9) $C_3$–$C_{10}$ cycloalkyl where at least two of the substitutents $R_1$ to $R_5$ are part of a cyclic or polycyclic ring system.

5. The method of claim 1 where in the Lewis base is a tetra substituted ammonium hydroxide of an organic counterion having the formula:

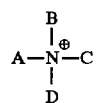

Formula 1 where the substituents A, B, C and D may be:

1) $C_1$–$C_{10}$ alkyl;
2) $C_3$–$C_{10}$ cycloalkyl;
3) $C_6$–$C_{12}$ aryl or alkylaryl ($C_1$–$C_{10}$ alkyl, $C_6$–$C_{12}$ aryl) substituents;
4) $C_1$–$C_{10}$ alkyloxy or $C_3$–$C_{10}$ cycloalkyloxy;
5) $C_6$–$C_{12}$ aryloxy;
6) $C_1$–$C_{10}$ alkyl or $C_6$–$C_{12}$ aryl carboxylic acid or ester —COOR and keto-substituents —C(=O)R, where R is H, $C_1$–$C_{10}$ alkyl or $C_6$–$C_{12}$ aryl;
7) amino, $C_1$–$C_5$ alkyl- and dialkylamino;
8) $C_3$–$C_{10}$ cycloalkylamino and dicycloalkylamino;
9) $C_3$–$C_{10}$ cycloalkyl where at least two of the substitutents A to D are part of a $C_3$–$C_{10}$ cyclic or polycyclic ring system.

\* \* \* \* \*